United States Patent [19]
Baliga

[11] Patent Number: 5,233,215
[45] Date of Patent: Aug. 3, 1993

[54] SILICON CARBIDE POWER MOSFET WITH FLOATING FIELD RING AND FLOATING FIELD PLATE

[75] Inventor: Bantval J. Baliga, Raleigh, N.C.

[73] Assignee: North Carolina State University at Raleigh, Raleigh, N.C.

[21] Appl. No.: 895,592

[22] Filed: Jun. 8, 1992

[51] Int. Cl.⁵ .................. H01L 23/58; H01L 31/0312; H01L 29/76; H01L 23/58

[52] U.S. Cl. ..................................... 257/490; 257/77; 257/339; 257/495; 257/496

[58] Field of Search ................... 357/23.2, 23.4, 52, 357/53, 61; 437/100; 257/339, 409, 490, 487, 495, 496, 77

[56] References Cited

U.S. PATENT DOCUMENTS

| | | | |
|---|---|---|---|
| 4,414,560 | 11/1983 | Lidow | 357/53 |
| 4,567,502 | 1/1986 | Nakagawa et al. | 357/53 |
| 4,999,684 | 3/1991 | Temple | 357/53 |
| 5,003,372 | 3/1991 | Kim et al. | 357/53 |
| 5,072,266 | 12/1991 | Bulucea et al. | 357/23.4 |

FOREIGN PATENT DOCUMENTS

| | | | |
|---|---|---|---|
| 58-17676 | 2/1983 | Japan | 357/52 |
| 61-89666 | 5/1986 | Japan | 357/53 |
| 62-11272 | 1/1987 | Japan | 357/52 |
| 63-227063 | 9/1988 | Japan | 357/52 |

OTHER PUBLICATIONS

*Modern Power Devices*, B. J. Baliga, pp. 79–119 and pp. 263–343.

*An Ultra-Low On-Resistance Power MOSFET Fabricated by Using a Fully Self-Aligned Process*, D. Ueda, H. Takagi and G. Kano, IEEE Transactions on Electron Devices, vol. ED-34, No. 4, Apr. 1987, pp. 926–930.

Numerical and Experimental Comparison of 60 V Vertical Double-Diffused MOSFETs and MOSFETs with a Trench-Gate Structure, H. R. Chang, Solid-State Electronics vo. 32, No. 3, 1989, pp. 247–251.

Trench DMOS Transistor technology for High-Current (100 A Range) Switching, C. Bulucea and R. Rossen, Solid-State Electronics, vol. 34, No. 5, 1991, pp. 493–507.

*Primary Examiner*—Rolf Hille
*Assistant Examiner*—Steven Loke
*Attorney, Agent, or Firm*—Bell, Seltzer, Park & Gibson

[57] ABSTRACT

A silicon carbide power MOSFET device includes a first silicon carbide layer, epitaxially formed on the silicon carbide substrate of opposite conductivity type. A second silicon carbide layer of the same conductivity type as the substrate is formed on the first silicon carbide layer. A power field effect transistor is formed in the device region of the substrate and in the first and second silicon carbide layers thereover. At least one termination trench is formed in the termination region of the silicon carbide substrate, extending through the first and second silicon carbide layers thereover. The termination trench defines one or more isolated mesas in the termination region which act as floating field rings. The termination trenches are preferably insulator lined and filled with conductive material to form floating field plates. The outermost trench may be a deep trench which extends through the first and second silicon carbide layers and through the drift region of the silicon carbide substrate. Since the termination region is formed from the first and second silicon carbide layers in the termination region, a time consuming, high temperature diffusion to form a floating field ring is not necessary. Rather, the same epitaxial first and second silicon carbide layers which are used to form an FET in the device region may also be used to form the floating field ring in the termination region.

24 Claims, 6 Drawing Sheets

SILICON CARBIDE POWER MOSFET WITH FLOATING FIELD RING AND FLOATING FIELD PLATE

FIELD OF THE INVENTION

This invention relates to semiconductor devices, and more particularly to semiconductor power devices and methods for fabricating such devices.

BACKGROUND OF THE INVENTION

Power devices are widely used to carry large currents at high voltages. Since the early 1950's, developers of electronic power systems began to base their high power systems on semiconductor devices.

The power bipolar transistor was first developed in the early 1950's, and its technology has matured to a high degree, allowing the fabrication of devices with current handling capability of several hundred amperes and blocking voltages of 600 volts. However, despite the attractive power ratings achieved for bipolar transistors, there are several fundamental drawbacks in their operating characteristics. First, the bipolar transistor is a current-controlled device. A large base-drive current, typically one fifth to one tenth of the collector current, is required to maintain the power bipolar transistor in the on state. Even larger reverse base drive currents are necessary to obtain high speed turn-off. These characteristics make the base drive circuitry complex and expensive.

Bipolar transistors are also vulnerable to a second breakdown failure mode under the simultaneous application of a high current and high voltage to the device, as would commonly be required in inductive power circuits. It is also difficult to parallel bipolar power devices because the forward voltage drop in bipolar transistors decreases with increasing temperature. This decrease in forward voltage drop promotes diversion of the current to a single device which can lead to device failure.

The power Field Effect Transistor (FET) was developed to solve the performance limitations of power bipolar transistors. Power FETs are typically variants of the Insulated Gate FET (IGFET) or the Metal Insulator Semiconductor FET (MISFET). These device types are commonly referred to as Metal Oxide Semiconductor Field Effect Transistors (MOSFET) because they include a conducting gate electrode, typically metal, that is separated from a semiconductor surface by an intervening insulator, typically silicon dioxide. Accordingly, all field effect transistors which use a conducting gate electrode separated from a semiconductor surface by an intervening insulator will be referred to herein as MOSFETs.

The power MOSFET applies a control signal to the metal gate electrode that is separated from the semiconductor surface by an oxide. Accordingly, the control signal required is essentially a bias voltage with no significant steady-state gate current flow in either the on-state or the off-state. Even when switching between these states, the gate current is small because it only serves to charge and discharge the input gate capacitance. The high input impedance is a primary feature of the power MOSFET that greatly simplifies the gate drive circuitry and reduces the cost of the power electronics.

Moreover, because current conduction in the MOSFET occurs through majority carrier transport only, no delays are observed as a result of storage or recombination of minority carriers in power MOSFETs during turn off. Their switching speed is therefore orders of magnitude faster than that of bipolar transistors. Power MOSFETs also possess an excellent safe operating area. That is, they can withstand the simultaneous application of high current and voltage for a short duration without undergoing destructive failure due to second breakdown. Power MOSFETs can also easily be paralleled, because the forward voltage drop of power MOSFETs increases with increasing temperature. This feature promotes an even current distribution in parallel devices.

In view of the above desirable characteristics, many variations of power MOSFETs have been designed for power devices. Two of the most popular types are the double-diffused MOS (DMOS) device and an ultra-low on-resistance MOS device (UMOS). Both of these devices are vertical devices, in which the source is located on one face of a semiconductor substrate and the drain is located at the opposite face of the semiconductor substrate, so that carrier movement is transverse to the faces of the semiconductor substrate.

The DMOS structure, and its operation and fabrication are described in the textbook entitled *Modern Power Devices,* authored by the present inventor, the disclosure of which is hereby incorporated herein by reference. Chapter 6 of this textbook describes power MOSFETs at pages 263-343. FIG. 1 herein is a reproduction of FIG. 6.1(a) from the above cited textbook, and illustrates a cross-sectional view of a basic DMOS structure. As shown, the DMOS structure is fabricated using planar diffusion technology, with a refractory gate such as polycrystalline silicon (polysilicon). The p-base region and the n+ source region are typically diffused through a common window defined by the edge of the polysilicon gate. The p-base region is driven in deeper than the n+ source. The difference in the lateral diffusion between the p-base and n+ source regions defines the surface channel region. The p-n junction between the p-base region and the n-drift region provides forward blocking capability to carrier current from drain to source.

In the power DMOS, a conductive path is formed, extending between the n+ source region and the n-drift region. This can be accomplished by applying a positive gate bias to the gate electrode. The gate bias modulates the conductivity of the channel region by the strong electric field created normal to the semiconductor surface through the oxide layer. The gate induced electric field attracts electrons to the surface of the p-base region under the gate. This field strength is sufficient to create a surface electron concentration that overcomes the p-base doping. The resulting surface electron layer in the channel provides a conductive path between the n+ source regions and the drift region. Application of a positive drain voltage results in current flow between drain and source through the n-drift region and the channel.

To switch the power DMOS to the off-state, the gate bias voltage is reduced to zero by externally short circuiting the gate electrode to the source electrode. In order to insure that parasitic bipolar transistor operation is kept inactive during operation of the power DMOS, the p-base region is short circuited to the n+ emitter region by the source metallization shown in FIG. 1.

The UMOS device, also referred to as a "Trench DMOS" device, is described in publications entitled *An Ultra-Low On-Resistance Power MOSFET Fabricated by Using a Fully Self-Aligned Process*, by Ueda et al., IEEE Transactions on Electron Devices, Vol. ED34, No. 4, April, 1987, pp. 926-930; *Numerical and Experimental Comparison of 60V Vertical Double-Diffused MOSFETS and MOSFETS with a Trench-Gate Structure* by Chang, Solid State Electronics, Vol. 32, No. 3, pp. 247-251, 1989; and *Trench DMOS Transistor Technology for High-Current (100A Range) Switching* by Buluce et al., Solid State Electronics, Vol. 34, No. 5, pp. 493-507, 1991. The UMOS is a rectangular (U-shaped) groove MOSFET with a high packing density and a reduced channel resistance. The device is fabricated by diffusing p-body and n+ source regions into an n-epitaxial drift region of an n+ wafer. Reactive ion etching is used to form rectangular grooves or trenches in the substrate, followed by a gate oxidation. A first polysilicon layer is grown and slightly oxidized and a second polysilicon layer is deposited for groove filling. In order to form the gate, the first polysilicon layer is etched off and then the device is metallized. FIG. 2 herein is a reproduction of a portion of FIG. 1 of the above identified Ueda et al. publication illustrating an embodiment of the UMOS structure.

The above description of power MOSFETs has assumed that the junctions are semi-infinite. However, for practical devices it is necessary to consider edge effects to obtain a realistic design. The edge termination limits the breakdown voltage of practical devices to below the theoretical limits set by semi-infinite junction analysis. If the junction is poorly terminated, its breakdown voltage can be as low as 10-20% of the theoretical case. This severe degradation in breakdown voltage can seriously compromise the device design and lead to reduced current ratings as well.

Accordingly, much effort has been focused on the proper termination of the device region of power MOSFETs. It has been found that the diffusion process through a mask layer creates cylindrical junctions at the mask edges and spherical junctions at the sharp corners of the mask. These curvatures result in severe reduction in the breakdown voltage as a result of electric field crowding.

The art has solved the junction termination problem by providing a specially designed termination region around the periphery of the device. One approach for solving the termination problem uses "floating field rings". Floating field rings are formed of diffused regions that are isolated from the main junction but located close to it. These regions can assume a potential intermediate to that of either side of the junction. Their potential is established by the depletion layer extending from the main junction. Floating field rings are usually fabricated simultaneously with the main junction, because this can be achieved by creating an extra diffusion window in the mask that surrounds the main junction.

A detailed discussion of the design and fabrication of floating field rings and the manner in which they solve the breakdown voltage problem may be found in Section 3.6 of the above cited textbook by the present inventor, pages 79-100. A properly designed floating field ring can result in nearly a two-fold increase in the device's breakdown voltage. Multiple field rings can result in higher increases. FIG. 3 illustrates a silicon power UMOSFET structure including two diffused floating field rings in the termination region. The diffused floating field rings are typically fabricated by patterning the p-base diffusion at the device edges to form a planar termination to obtain high breakdown voltages.

Another approach for solving the termination problem uses "field plates". The field plate is typically a metal or other conductor ring at the edge of the planar junction. By altering the potential on the field plate, the depletion layer shape can be adjusted. The field plate is typically created by extending the junction metallization over the oxide. The presence of the field plate at the diffusion region potential forces the depletion layer to extend at the surface beyond the edge of the field plate. This reduces the depletion layer curvature and reduces the electric field. A detailed discussion of the design and fabrication of field plates and the manner in which they solve the breakdown voltage problem may be found in Section 3.6.7 of the above cited textbook by the inventor pp. 116-119. Typically, a field plate is used in conjunction with one or more floating field rings to achieve high breakdown voltage.

Almost all power MOSFETs being marketed today are fabricated in monocrystalline silicon. However, as is known to those skilled in the art, crystalline silicon carbide is particularly well suited for use in semiconductor devices, and in particular, for power semiconductor devices. Silicon carbide has a wide bandgap, a high melting point, a low dielectric constant, a high breakdown field strength, a high thermal conductivity and a high saturated electron drift velocity compared to silicon. These characteristics would allow silicon carbide power devices to operate at higher temperatures, higher power levels and with lower specific on resistance than conventional silicon based power devices.

A power MOSFET such as the above described DMOSFET or UMOSFET can be readily translated into silicon carbide using known manufacturing techniques. However, the formation of the floating field rings in the termination region would require very high temperature diffusions for very long time periods because the diffusion coefficient for dopants is much smaller in silicon carbide than in silicon. The use of these high temperatures would require specialized equipment that would increase processing costs. Moreover, the long diffusion times would add to the process cycle time, and adversely impact manufacturing volume and cost.

SUMMARY OF THE INVENTION

It is therefore an object of the invention to provide an improved power MOSFET and method of making the same.

It is another object of the present invention to provide an improved silicon carbide power MOSFET and method of making the same.

It is yet another object of the present invention to provide an improved termination region for a silicon carbide power MOSFET and method of making the same.

These and other objects are provided, according to the present invention, by a silicon carbide power FET device formed in a silicon carbide substrate of first conductivity type (for example n-type), having first and second opposing faces, and including a device region extending from the first face to the second face and a termination region extending from the first face to the second face. A first silicon carbide layer of second conductivity type (for example p-type) is formed on the first face, extending over the device region and the termination region. A second silicon carbide layer of the first conductivity type (n-type) is formed on the first silicon carbide layer, extending over the device region and preferably also extending over the termination region of the substrate. A power field effect transistor is formed in the device region of the silicon carbide substrate and in the first and second silicon carbide layers over the device region.

A termination trench is formed in the termination region of the silicon carbide substrate, extending through the first and preferably the second silicon carbide layers thereover. The termination trench defines an isolated mesa in the first silicon carbide layer and preferably in the second silicon carbide layer in the termination region. This isolated mesa acts as a floating field ring to reduce the electric field at the edge of the device.

The termination trench is preferably filled with a conductive material such as polysilicon. The conductive material is preferably insulated from the silicon carbide surrounding the trench by lining the trench with an insulator. A floating field plate is thereby formed.

A plurality of concentric conductive trenches may be formed to encircle the device region of the substrate and define a plurality of floating field ring mesas. The outermost trench may be a deep trench which extends through the first and second silicon carbide layers and through the drift region of the silicon carbide substrate.

The power device of the present invention is preferably made by epitaxially growing a first silicon carbide layer of second conductivity type (for example p-type) on the first face of a silicon carbide substrate of first conductivity type (for example n-type), over the device region and termination region of the silicon carbide substrate. Then, a second silicon carbide layer of the first conductivity type is epitaxially grown on the first silicon carbide layer, over the device region and preferably also over the termination region of the substrate. Alternatively, the top surface of the first silicon carbide layer is converted to the first conductivity type by a diffusion or implantation of first conductivity type dopants.

A power field effect transistor is formed in the device region of the silicon carbide substrate and in the first and second silicon carbide layers thereover. A termination trench is etched in the termination region of the silicon carbide substrate through the first and second silicon carbide layers thereover. The trench is lined with oxide or another insulator and then filled with polysilicon or another conductor.

Since the termination region is formed from the first and second silicon carbide layers in the termination region, a time consuming, high-temperature diffusion to form a floating field ring is not necessary. Rather, the same epitaxial first and second silicon carbide layers which are used to form the FET in the device region may also be used to form the floating field ring in the termination region. The needs for high temperatures to form the diffused floating field ring, and for specialized high temperature processing equipment, may be eliminated. The long diffusion times and the associated long process cycle time may also be eliminated, so that a low cost device may be fabricated.

It will be understood by those having skill in the art that the mesas produced by the trenches in the termination regions may be used independently of conductor filled trenches in the termination regions to form a floating field ring for the silicon carbide power FET. Moreover, the conductor filled, insulator lined trenches in the termination region may be formed without the mesas, to form a floating field plate. However, it will be understood by those having skill in the art that the mesas and insulator lined conductive trenches are preferably used together, to provide improved termination for a silicon carbide based power FET.

DESCRIPTION OF A PREFERRED EMBODIMENT

Figure 1:
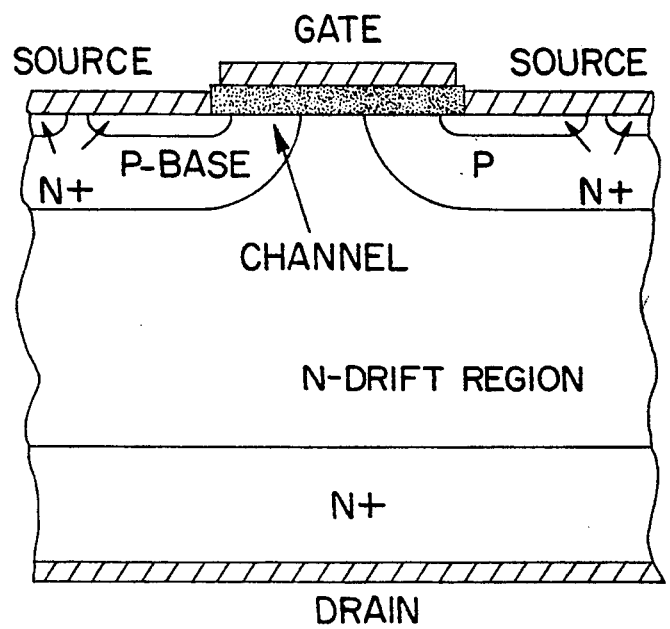
FIG. 1 is a cross-sectional side view of a known DMOSFET device.
Figure 2:
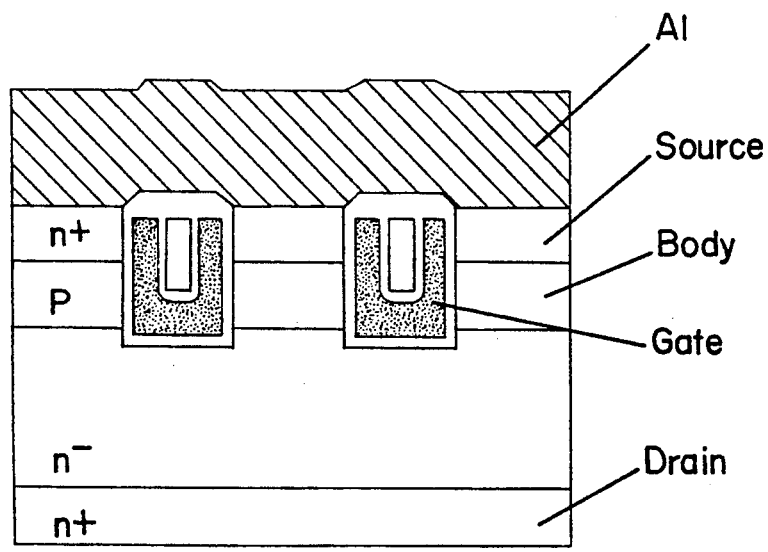
FIG. 2 is a cross-sectional side view of a known UMOSFET device.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
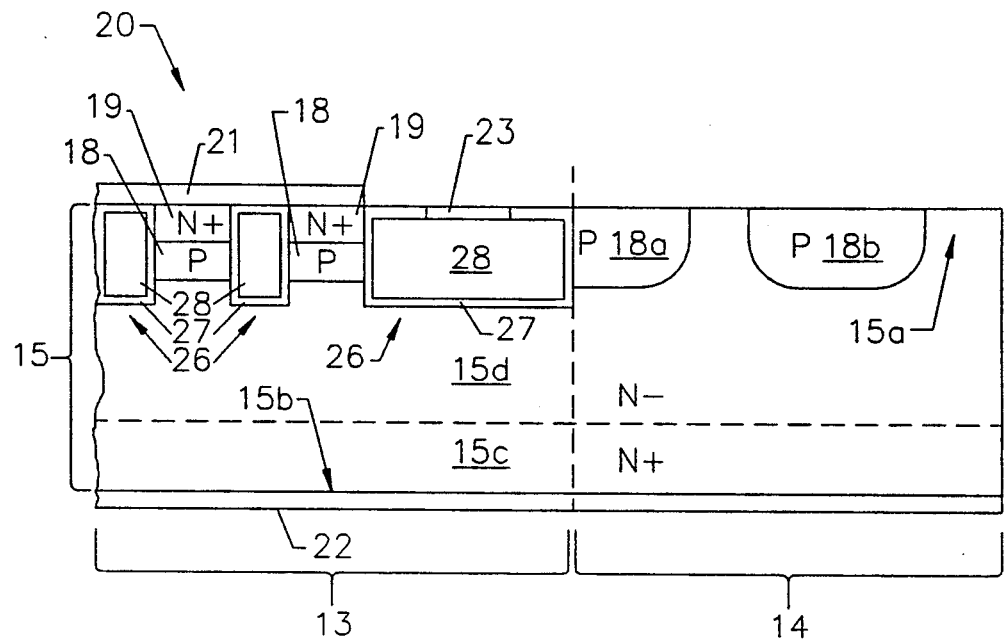
FIG. 3 is a cross-sectional side view of a known silicon based power UMOSFET device.

Referring now to FIG. 3 a prior art silicon power UMOSFET is illustrated. As shown, the silicon power UMOSFET 20 is formed in a monocrystalline silicon substrate 15 of first conductivity type (here n-type). The silicon substrate 15 includes a device region 13, generally interior to the substrate, and a termination region 14 generally a peripheral region of the substrate. The substrate 15 may also include a relatively heavily doped region 15c and a relatively lightly doped drift region 15d.

As shown in FIG. 3, a p-type diffusion 18 is formed at the first face 15a of silicon substrate 15. The p-type diffusion also forms a plurality of floating field rings 18a, 18b in the termination region 14. It will be understood by those having skill in the art that although two termination rings 18a, 18b are shown, a single ring or more than two rings may be provided.

In the device region 13, an n+ type diffusion 19 is also formed within p-type diffusion layer 18. One or more gate regions 26 may be used to define multiple parallel source regions. The gate regions 26 include an insulating layer 27 such as silicon dioxide and a conducting layer 28 such as polycrystalline silicon. A polycrystalline silicon gate contact 23 is formed on the conducting layer 28. Source and drain contacts 21 and 22 respectively are also provided. The design and fabrication of the UMOS device of FIG. 3 is well known to those having skill in the art and will not be described further herein.

As already described, the silicon power UMOSFET structure of FIG. 3 could be readily translated into silicon carbide using known manufacturing techniques. However, the formation of the floating field rings 18a, 18b in the termination region would require very high temperature diffusions for very long time periods because the diffusion coefficient for dopants is much smaller in silicon carbide than in silicon. The use of these high temperatures would require specialized equipment which would increase processing costs. Moreover, the long diffusion time would add to the process cycle time and adversely impact manufacturing volume and cost.

Figure 4:
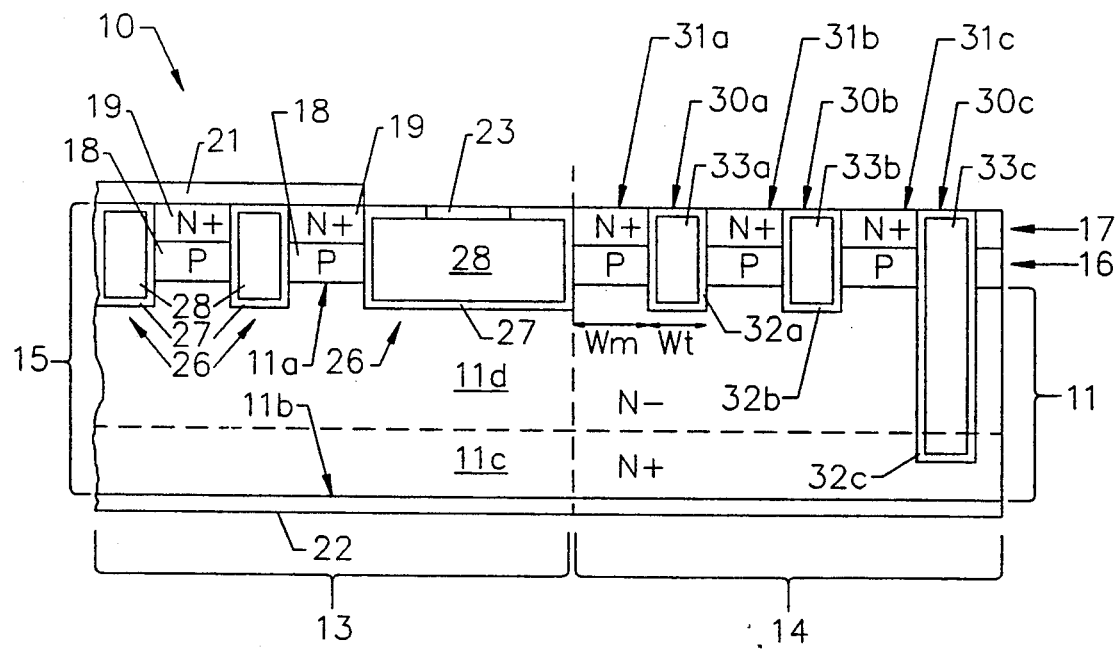
FIG. 4 is a cross-sectional side view of a first embodiment of a silicon carbide power device according to the present invention.

Referring now to FIG. 4 there is illustrated an embodiment of the invention which overcomes these problems. As shown in FIG. 4, power MOSFET 10 includes a silicon carbide substrate 11, having a first (top) face 11a and a second (bottom) face 11b. The silicon carbide substrate 11 includes a relatively heavily doped region 11c of first conductivity type (here, n+) adjacent the second face, and a relatively lightly doped region of first conductivity type (here, n−) 11d adjacent the first face. It Will be understood by those having skill in the art that drift region 11d is preferably epitaxially formed on heavily doped region 11c using epitaxial growth techniques well known to those having skill in the art.

The silicon carbide substrate 11 also includes a device region 13 and a termination region 14. As described above, device region 13 is typically interior to the substrate and termination region 14 is typically at the periphery of the substrate. However, multiple devices can be formed on a single substrate, in which case a peripheral region may surround each device region on the substrate.

Still referring to FIG. 4, a first silicon carbide layer 16 of second conductivity type (here p) is formed on the first face 11a and extends over the device region 13 and the termination region 14. A second silicon carbide layer 17 of first conductivity type (here n+) is located on the first silicon carbide layer and extends over the device region 13 and preferably also extends over the termination region 14. However, second silicon carbide layer need not extend over termination region 14. First silicon carbide layer 16 and second silicon carbide layer 17 are preferably formed by epitaxial growth on drift region 11d, thereby eliminating the need for long diffusion times at high temperature. However, it will be understood by those having skill in the art that the second silicon carbide layer 17 may be formed by diffusing n-type dopants into p-type first silicon carbide layer 16, to convert the exposed surface of first silicon carbide layer 16 into n-type.

A power MOSFET, such as the UMOS structure already described, is formed in device region 13. As already described, the FET includes gate regions 26 having an insulator 27 and polycrystalline silicon or another conductor 28 therein, and a (polysilicon) gate contact 23. Source and drain contacts 21 and 22 complete the device. It will be understood by those having skill in the art that other silicon-based power MOSFET designs can be translated into the device region 13 of silicon Carbide substrate 11, or new designs for power MOSFETs Which are unique to silicon carbide and its characteristics, may be included. It will also be understood by those having skill in the art that the conductivities shown herein may be reversed to provide a complementary device, and the source and drain designations shown herein may also be reversed.

Still referring to FIG. 4, the power device according to the present invention includes unique termination areas in the termination region 14. As shown, a termination trench 30a is formed in the termination region 14, extending through the first and preferably the second silicon carbide layers 16 and 17 to define a mesa 31a of the first and preferably the second silicon carbide layers 16 and 17 respectively over the termination region. The termination trench preferably includes a conductive material 33a, such as polysilicon, therein. The termination trench 30a a is also preferably lined with insulating material 32a such as silicon dioxide. The mesa 31a forms a floating field ring to effectively terminate the MOSFET device. The conductor filled termination trench 30a forms a floating field plate for effectively terminating the silicon carbide field effect transistor.

The width of the trench $W_t$ and the width of the mesa $W_m$ may be varied to optimize the termination of the device. The optimum widths $W_m$ and $W_t$ will be dependent upon the device type and device size of the power MOSFET, and may be determined mathematically, empirically, or by computer simulation. Size and location considerations for a floating field ring and a field plate of a conventional silicon based device are described at pages 92–99 and 116–119 of the above identified textbook by the inventor. Similar design considerations apply for the invention.

As also shown in FIG. 4, a second termination trench 30b may be formed in the termination region 14 of the silicon carbide substrate to define a second mesa 31b in the first and preferably the second silicon carbide layers 16 and 17 respectively. The second termination trench 30b may be lined with oxide 32b and filled with a conductor such as polycrystalline silicon 33b. Preferably, trench 30b is concentric to trench 30a, which is also concentric to the device itself. It will also be understood that more than two trenches may be formed.

Finally, as also shown in FIG. 4, a deep termination trench 30c may also be formed, extending through the first and preferably the second silicon carbide layers 16 and 17 and through the drift region 11d. This deep trench 30c is preferably the outermost trench and may be used for isolation as well as termination. This deep trench 30c also preferably has an insulating lining 32c and is filled with a conductor 33c.

It will be understood by those having skill in the art that the polysilicon 33a–33c, or other conductive material in the trenches formed in the termination region are not connected to the gate terminal 23. Accordingly, they behave as floating field plates. Similarly, the mesas 31a–31c are not connected to the source terminal 21 so that they behave as floating field rings.

Figure 5:
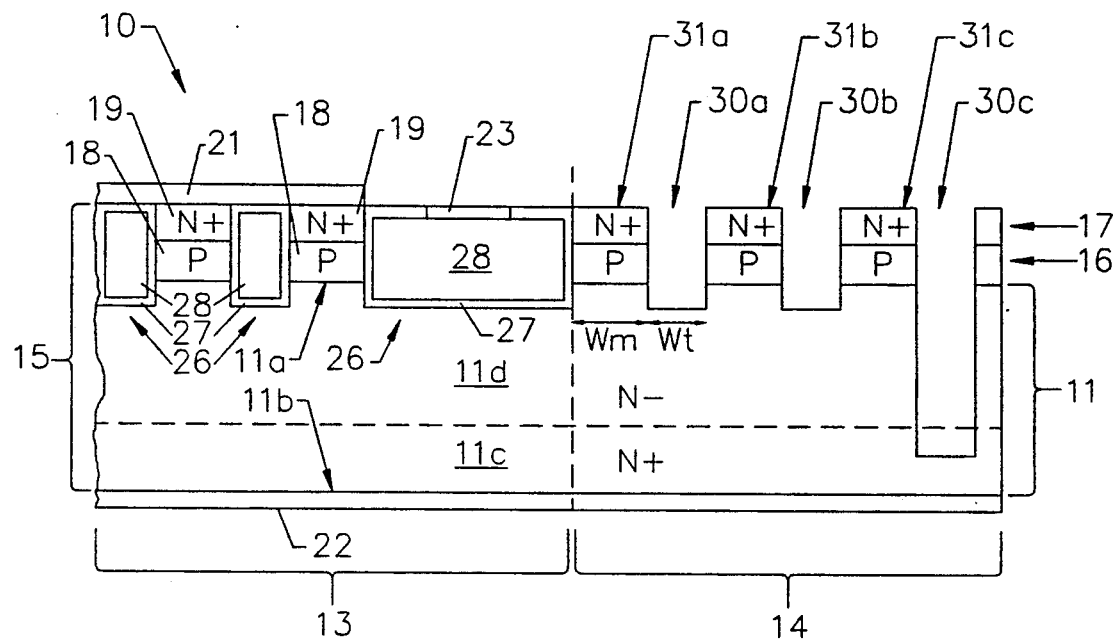
FIG. 5 is a cross-sectional side view of a second embodiment of a silicon carbide power device according to the present invention.
Figure 6:
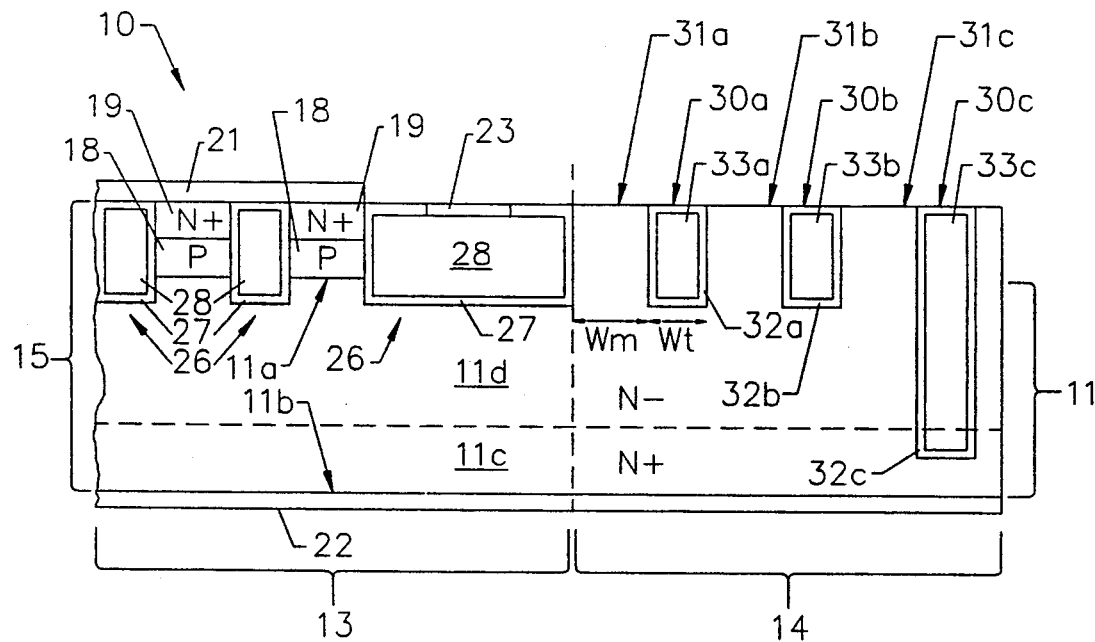
FIG. 6 is a cross-sectional view of a third embodiment of a silicon carbide power device according to the present invention.

It will also be understood by those having skill in the art that the termination trenches 30 and the termination mesas 31 may operate independently of one another. FIG. 5 illustrates a configuration of mesas 31a, 31b, and 31c which are defined by trenches 30a, 30b and 30c, wherein the trenches are not filled with a conductive material as was the case in FIG. 4. Trenches 30a, 30b and 30c may be filled with an insulating material to provide planarity. Conversely, FIG. 6 illustrates termination trenches 30a, 30b and 30c, lined with insulator 32a, 32b and 32c and filled with polysilicon 33a, 33b, and 33c respectively, without the use of mesas 31a, 31b, and 31c. However, it will be understood by those having skill in the art that mesas 31a, 31b and 31c and conductor filled, insulator lined trenches 30a, 30b and 30c preferably operate together to form a termination region.

Referring now to FIGS. 7A-7F, a process for forming a power device according to the present invention will now be described. As shown, a silicon carbide substrate such as an n-type silicon carbide substrate having $10^{19}$ dopants $cm^{-3}$ is provided. Drift region 11d is epitaxially grown on region 11c using nitrogen or other n-type dopants at a concentration of $10^{\neq} cm^{-3}$. Region 11c is preferably between about 100 $\mu m$ to 500 $\mu m$ thick, and region 11d is preferably about 5 $\mu m$ to 30 $\mu m$ thick.

Figure 7A:
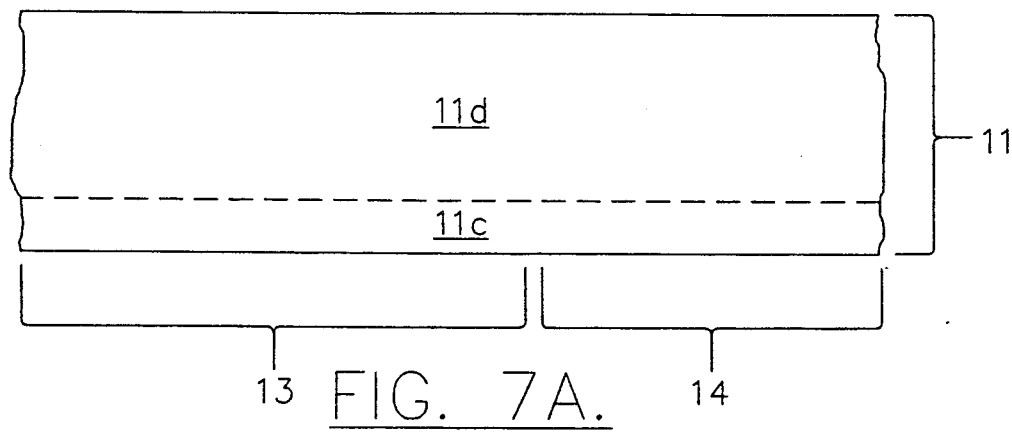
FIGS. 7A–7F are cross-sectional side views of the silicon carbide power device of FIG. 4 during intermediate processing steps.
Figure 7B:
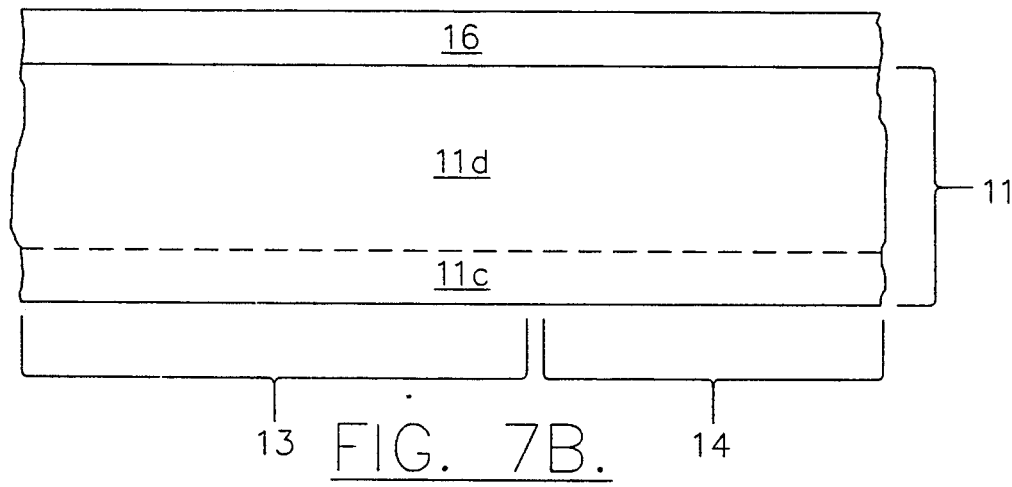

Then, referring to FIG. 7B, the first silicon carbide layer 16 is epitaxially grown on drift region 11d. During epitaxial growth, the first epitaxial layer 16 is doped with aluminum or other p-type atoms at a concentration of $10^{17}$ atoms $cm^{-3}$. First epitaxial layer 16 is preferably 0.5 $\mu m$ to 2 $\mu m$ thick.

Figure 7C:
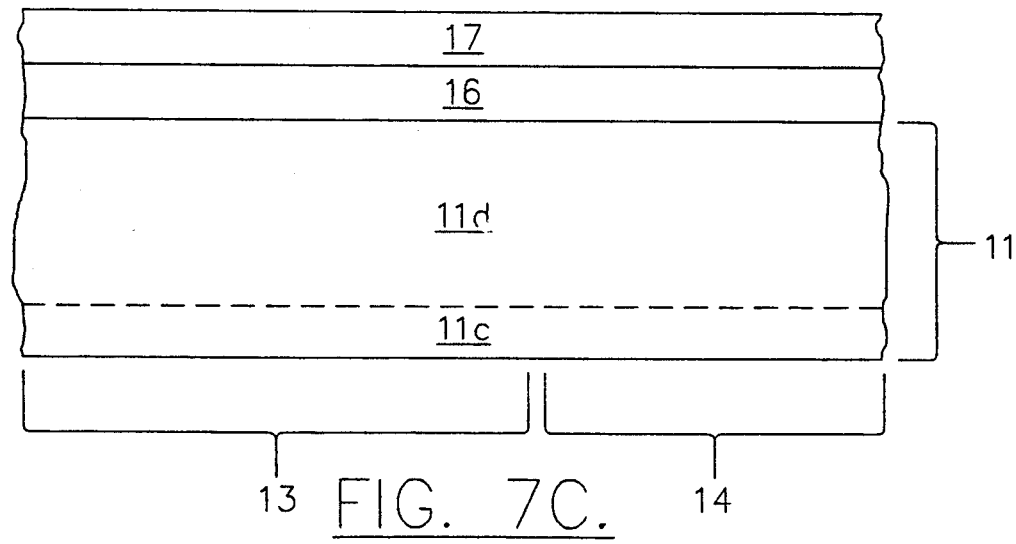

Then, referring to FIG. 7C, second silicon carbide layer 17 is epitaxially formed on first silicon carbide layer 16. During epitaxial growth, layer 17 is doped with nitrogen or other n-type atoms at a concentration of $10^{19}$ atoms $cm^{-3}$. Layer 17 is preferably about 0.25 $\mu m$-1 $\mu m$ thick. It will be understood by those having skill in the art that second silicon carbide layer 17 may also be formed by diffusing nitrogen or other n-type atoms into silicon carbide layer 16, since formation of relatively shallow region 17 would not require inordinately long diffusion times. It will also be understood by those having skill in the art that layers 11c, 11d, 16 and 17 form a monolithic crystalline structure due to the epitaxial growth process.

Figure 7D:
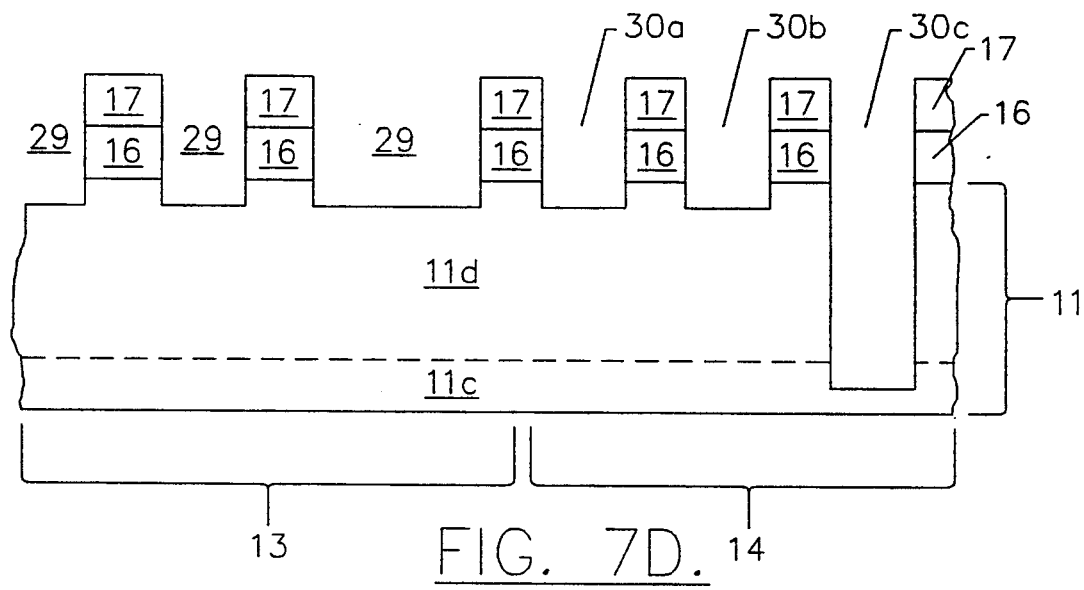

Referring now to FIG. 7D, device trenches 29 and termination trenches 30a-30c may be formed using a known reactive ion trench etch process. Trench 30c may be etched deeply through drift region 11d, while the remaining trenches are etched through first and second silicon carbide layers 16 and 17 respectively.

Figure 7E:
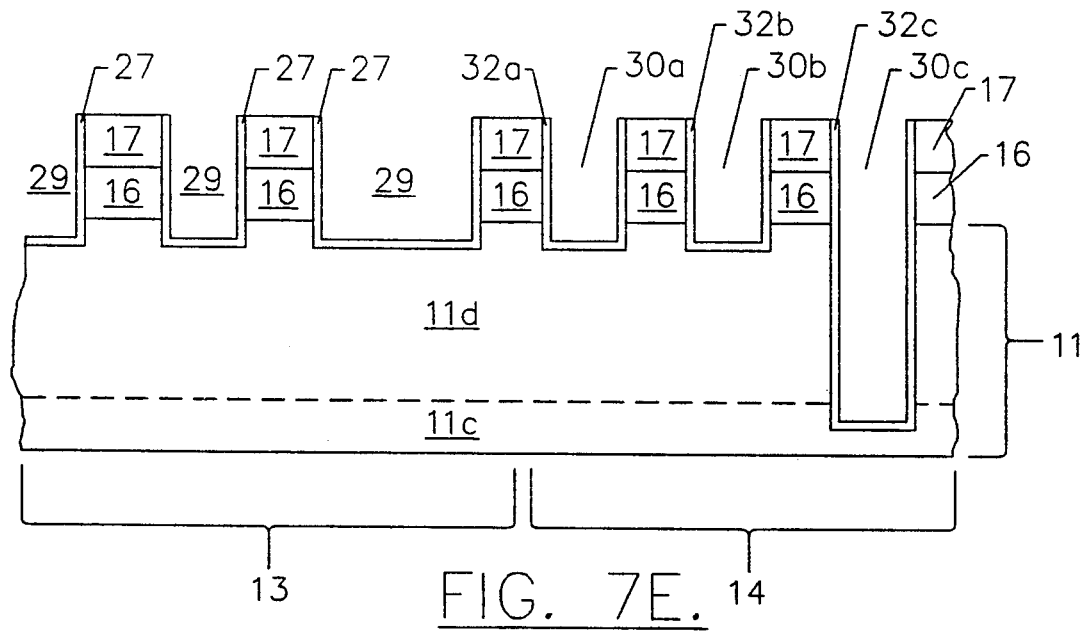
Figure 7F:
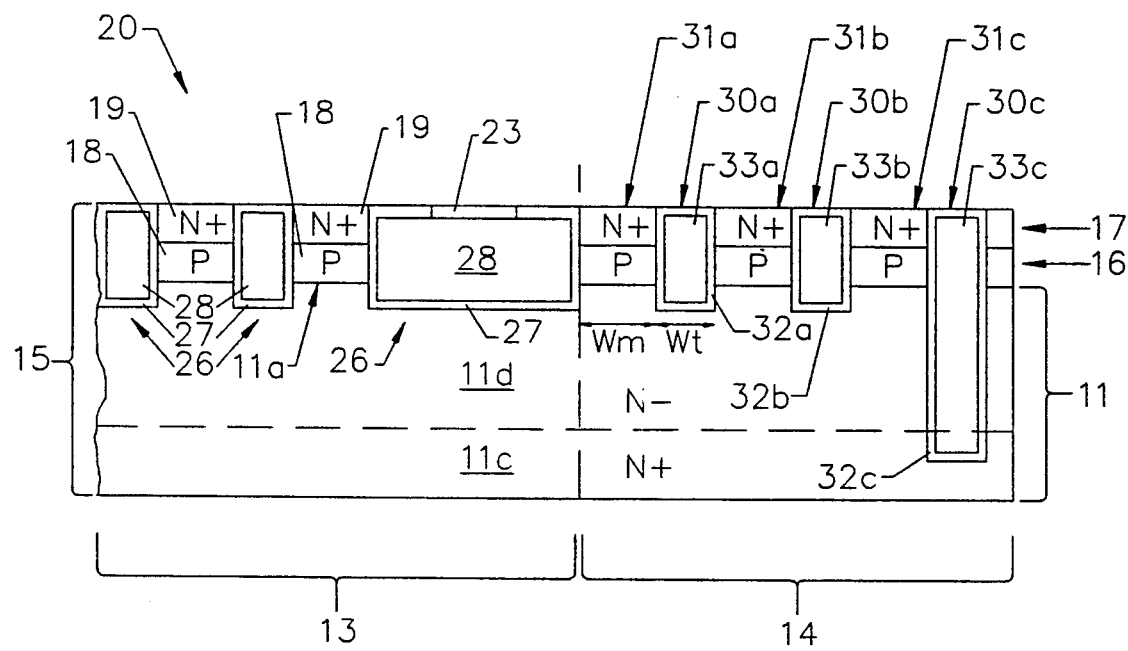

Then, as shown in FIG. 7E, a thin insulating layer is grown by thermal oxidation at 1100°-1200° C. using wet oxidation, to form insulating layers 27 and 32a-32c. As shown in FIG. 7F, the trenches are then filled with polysilicon or metal to form regions 28 and 33a-33c. Polysilicon trench filling may be accomplished, for example, by chemical vapor deposition at 900° C. using silane. The polysilicon or metal may be oxidized to fully encapsulate the polysilicon regions in oxide. Source, drain and gate contacts 21, 22 and 23 may then be formed using known techniques.

Analysis of the silicon carbide power MOSFET described above indicates that these devices would have such low specific on-resistance that they could out-perform even a 5,000 volt silicon thyristor. This makes them candidates for replacement of all presently used silicon devices. By eliminating the need for long, high temperature diffusions, the devices may be made rapidly and inexpensively.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A power device comprising:
   a silicon carbide substrate of first conductivity type, having first and second opposing faces and including a device region extending from said first face to said second face, and a termination region extending from said first face to said second face;
   a first silicon carbide layer of second conductivity type on said first face, extending over said device region and said termination region;
   a second silicon carbide layer of said first conductivity type on said first silicon carbide layer, extending over said device region;
   a power field effect transistor in said device region of said silicon carbide substrate and in said first and second silicon carbide layers thereover; and
   a first termination trench in said termination region of said silicon carbide substrate, and extending through said first silicon carbide layer thereover, to define a mesa of said first silicon carbide layer over said termination region.

2. The power device of claim 1 wherein said first termination trench contains a conductive material therein.

3. The power device of claim 2 wherein said first termination trench is lined with insulating material, and contains said conductive material therein.

4. The power device of claim 2 wherein said conductive material is electrically isolated from said power field effect transistor.

5. The power device of claim 1 wherein said mesa is electrically isolated from said power field effect transistor.

6. The power device of claim 1 wherein said first termination trench encircles said device region.

7. The power device of claim 1 wherein said second silicon carbide layer also extends over said termination region, and wherein said first termination trench extends through said first and second silicon carbide layers thereon, to define a mesa of said first and second silicon carbide layers over said termination region.

8. The power device of claim 1 further comprising a second termination trench in said termination region of said silicon carbide substrate, extending through said first silicon carbide layer thereover to define a second mesa of said first silicon carbide layer between said first termination trench and said second termination trench, said second termination trench being laterally spaced apart from, and concentric to said first termination trench.

9. The power device of claim 8 wherein said second termination trench contains a conductive material therein.

10. The power device of claim 9 wherein said second termination trench is lined with insulating material, and contains said conductive material therein.

11. The power device of claim 1 wherein said silicon carbide substrate includes a lightly doped region of said first conductivity type adjacent said first face, and a heavily doped region of said first conductivity type adjacent said second face, and wherein said power device further comprises a deep termination trench in said termination region of said silicon carbide substrate, which extends through said first silicon carbide layer and through said lightly doped region.

12. The power device of claim 11 wherein said deep termination trench contains a conductive material therein.

13. The power device of claim 12 wherein said deep termination trench is lined with insulating material, and contains said conductive material therein.

14. The power device of claim 1 wherein said power field effect transistor includes a source contact on said second silicon carbide layer and a drain contact on said second face of said silicon carbide substrate.

15. A power device comprising:
a silicon carbide substrate of first conductivity type, having first and second opposing faces and including a device region extending from said first face to said second face, and a termination region extending from said first face to said second face;
a first silicon carbide layer of second conductivity type on said first face, extending over said termination region;
a power field effect transistor in said device region of said silicon carbide substrate; and
a first termination trench in said termination region of said silicon carbide substrate, said first termination trench extending through said first silicon carbide layer and being lined with insulating material, and containing a conductive material therein.

16. The power device of claim 15 wherein said conductive material is electrically isolated from said power field effect transistor.

17. The power device of claim 15 wherein said first termination trench encircles said device region.

18. The power device of claim 15 further comprising a second termination trench in said termination region of said silicon carbide substrate, said second termination trench being laterally spaced apart from, and concentric to said first termination trench, said second termination trench being lined with insulating material and containing a conductive material therein.

19. A power device comprising:
a silicon carbide substrate of first conductivity type, having first and second opposing faces and including a device region extending from said first face to said second face, and a termination region extending from said first face to said second face;
a first silicon carbide layer of second conductivity type on said first face, extending over said device region;
a second silicon carbide layer of said first conductivity type on said first silicon carbide layer, extending over said device region;
a power field effect transistor in said device region of said silicon carbide substrate and in said first and second silicon carbide layers thereover; and
a first termination trench in said termination region of said silicon carbide substrate, said first termination trench being lined with insulating material, and containing a conductive material therein;
wherein said silicon carbide substrate includes a lightly doped region of said first conductivity type adjacent said first face, and a heavily doped region of said first conductivity type adjacent said second face, and wherein said power device further comprises a deep termination trench in said termination region of said silicon carbide substrate, which extends through said lightly doped region, said deep termination trench being lined with insulating material and containing a conductive material therein.

20. A power device comprising:
a silicon carbide substrate of first conductivity type, having first and second opposing faces and including a device region extending from said first face to said second face, and a termination region extending from said first face to said second face;
a first silicon carbide layer of second conductivity type on said first face, extending over said device region and said termination region;
a second silicon carbide layer of said first conductivity type on said first silicon carbide layer, extending over said device region and said termination region;
a power field effect transistor in said device region of said silicon carbide substrate and in said first and second silicon carbide layers thereover; and
a first termination trench in said termination region of said silicon carbide substrate, extending through said first silicon carbide layer and said second silicon carbide layer thereover, to define a mesa of said first silicon carbide layer and said second silicon carbide layer over said termination region, said first termination trench being lined with insulating material, and containing a conductive material therein, said conductive material being electrically isolated from said power field effect transistor.

21. The power device of claim 20 wherein said first termination trench encircles said device region.

22. The power device of claim 20 further comprising a second termination trench in said termination region of said silicon carbide substrate, extending through said first and second silicon carbide layers thereover to define a second mesa of said first and second silicon carbide layers between said first termination trench and said second termination trench, said second termination trench being laterally spaced apart from, and concentric to said first termination trench, said second termination trench being lined with insulating material, and containing a conductive material therein, said conductive material being electrically isolated from said power field effect transistor.

23. The power device of claim 20 wherein said silicon carbide substrate includes a lightly doped region of said first conductivity type adjacent said first face, and a heavily doped region of said first conductivity type adjacent said second face, and wherein said power device further comprises a deep termination trench in said termination region of said silicon carbide substrate, which extends through said first silicon carbide layer and said second silicon carbide layer and through said lightly doped region, said deep termination trench being lined with insulating material, and containing a conductive material therein, said conductive material being electrically isolated from said power field effect transistor.

24. The power device of claim 20 wherein said power field effect transistor includes a source contact on said second silicon carbide layer and a drain contact on said second face of said silicon carbide substrate.

* * * * *